United States Patent [19]

Jackson et al.

[11] Patent Number: 5,412,335
[45] Date of Patent: May 2, 1995

[54] AREA-EFFICIENT CURRENT-INPUT FILTER, VIRTUAL GROUND CIRCUIT USED IN SAME, AND METHOD THEREFOR

[75] Inventors: H. Spence Jackson; Marcus W. May, both of Austin, Tex.

[73] Assignee: Motorola, Inc., Schaumburg, Ill.

[21] Appl. No.: 181,507

[22] Filed: Jan. 14, 1994

[51] Int. Cl.[6] ............................................. H03B 1/04
[52] U.S. Cl. .................................. 327/552; 330/306; 330/277
[58] Field of Search ................. 307/296.6, 520, 296.8, 307/296.4, 296.5; 328/165, 167; 330/306, 277; 327/552, 543, 546

[56] References Cited

U.S. PATENT DOCUMENTS

| | | | |
|---|---|---|---|
| 3,107,331 | 10/1963 | Barditch et al. | 307/520 |
| 3,549,910 | 12/1970 | Ogawa et al. | 307/296.6 |
| 4,555,623 | 11/1985 | Bridgewater et al. | 330/59 |
| 4,728,905 | 3/1988 | Zhiwei | 330/306 |
| 4,767,946 | 8/1988 | Taylor | 307/296.8 |

OTHER PUBLICATIONS

Serge Ramet; "A Low-Distortion Anti-Aliasing/-Smoothing Filter for Sampled Data Intergrated Circuits," Reprinted from IEEE J. Solid-St. Circuits; vol. SC-23, No. 5, pp. 343-346 (1988).

Primary Examiner—Timothy P. Callahan
Assistant Examiner—Eunja Shin
Attorney, Agent, or Firm—Paul J. Polansky

[57] ABSTRACT

A filter (62) receives an input current signal and provides a filtered output signal in response. The filter (62) presents an extremely low-impedance input node (72) to the source of the input current signal, such as a current digital-to-analog converter (DAC) (62), thus avoiding modulating the input current signal. The filter (62) includes a virtual ground circuit (70) connected to the input node (72) followed by a filter (80) such as a biquad filter. The virtual ground circuit (70) has a high-gain cascoded loop to provide an intermediate current at a high-impedance output terminal (82), which is connected to an input terminal of the filter (80). The virtual ground circuit (70) is implemented without operational amplifiers and resistors, thus providing high linearity without a large amount of integrated circuit area.

19 Claims, 1 Drawing Sheet

AREA-EFFICIENT CURRENT-INPUT FILTER, VIRTUAL GROUND CIRCUIT USED IN SAME, AND METHOD THEREFOR

FIELD OF THE INVENTION

This invention relates generally to electrical circuits, and more particularly, to current-input filters and related circuits.

BACKGROUND OF THE INVENTION

Sigma-delta digital-to-analog converters (DACs) have gained wide popularity in integrated circuit design due to the high resolution and high linearity obtainable without the need for precise matching of on-chip components. The digital modulator shapes the quantization noise to be very low in the passband and much higher at out of band frequencies. The actual conversion to an analog signal is then performed by a very coarse DAC, which is typically implemented with a switched capacitor circuit, or a current-mode DAC. In the latter case, an array of current sources, either binarily-weighted or monotonic, is switched relative to the code coming out of the digital modulator.

An important function in the sigma-delta DAC is the analog filter at the output which removes the out-of-band quantization noise created by the digital noise shaper. The order of that filter is dependent on the out-of-band noise specification. One distinct advantage of the current-mode DAC implementation is that the filter can be a continuous-time filter. If a switched capacitor DAC is used, then the filter is typically switched-capacitor also. In the case of the continuous-time filter, the input signal, which is a current, must be converted to a voltage either before, or as a part of the filtering process.

If the current-to-voltage conversion is performed with an operational amplifier and a feedback resistor (i.e., transimpedance amplifier), then a virtual ground is presented to the current DAC. This is very desirable since modulation of the finite output impedance of the current sources in the DAC can result in distortion. Some single operational amplifier biquadratic filters (biquads) will accept a current input directly by eliminating an input resistor, which would save circuit area. However, the biquad input node is only a virtual ground for very low frequencies, and will have signal-dependent modulation at higher frequencies in the passband. This modulation can cause distortion for the above-mentioned reason. It would be desirable, then, to have a filter structure which is more area-efficient than one with two operational amplifiers and their associated resistors, which also does not cause signal-dependent modulation of the current input signal.

SUMMARY OF THE INVENTION

Accordingly, the present invention provides, in one form, an area-efficient current-input filter including a first node, a filter, a first and second transistors, and first and second current sources. The first node receives an input current thereinto. The filter has an input terminal for receiving an intermediate current, and an output terminal for providing a filtered output signal in response to a predetermined filter transfer function applied to the intermediate current. The input terminal of the filter is coupled to a second node. The first transistor has a first current electrode coupled to the first node, a second current electrode coupled to the second node, and a control electrode. The first current source has a first terminal coupled to the first node, and a second terminal coupled to a first power supply voltage terminal. The second current source has a first terminal coupled to a second power supply voltage terminal, and a second terminal coupled to the control electrode of the first transistor. The second transistor has a first current electrode coupled to the control electrode of the first transistor, a control electrode coupled to the first node, and a second current electrode coupled to the first power supply voltage terminal.

In another form, the present invention provides a virtual ground circuit comprising first and second nodes, first and second transistors, and first and second current sources. The first node receives an input current thereinto. The second node provides an output current therefrom. The first transistor has a first current electrode coupled to the first node, a second current electrode coupled to the second node, and a control electrode. The first current source has a first terminal coupled to the first node, and a second terminal coupled to a first power supply voltage terminal. The second current source has a first terminal coupled to a second power supply voltage terminal, and a second terminal coupled to the control electrode of the first transistor. The second transistor has a first current electrode coupled to the control electrode of the first transistor, a control electrode coupled to the first node, and a second current electrode coupled to the first power supply voltage terminal.

In still another form, the present invention provides a method for filtering an input current to provide an output signal in response thereto. The input current is received at a first node. An intermediate current is provided to a second node in response to the input current at the first node. The intermediate current at the second node is filtered to provide the output signal in response to a predetermined filter transfer function. An amplifier is coupled between the first and second nodes, thereby reducing an impedance at the first node and increasing an impedance at the second node.

These and other features and advantages will be more clearly understood from the following detailed description taken in conjunction with the accompanying drawings.

DETAILED DESCRIPTION OF A PREFERRED EMBODIMENT

Figures 1, 2:
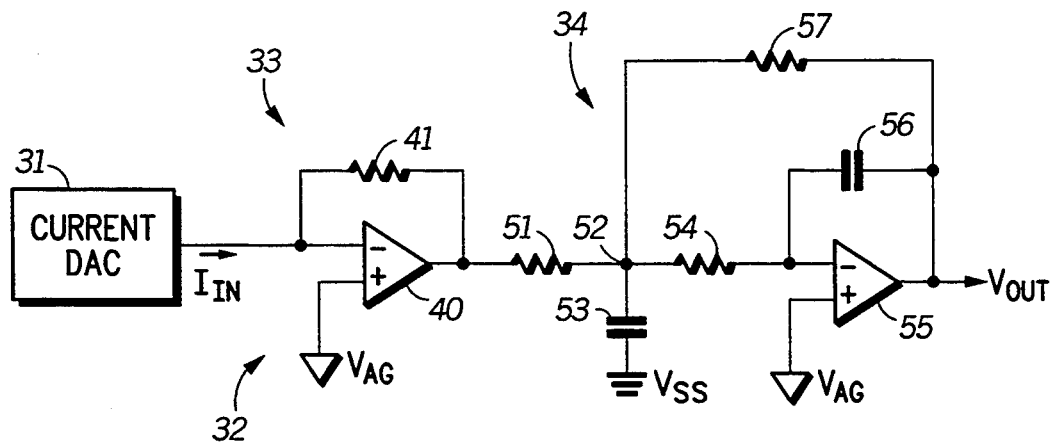
FIG. 1 illustrates in partial block diagram and partial schematic form a current-mode digital-to-analog converter (DAC) according to the prior art.
FIG. 2 illustrates in partial block diagram and partial schematic current-mode DAC using an area-efficient current-input filter according to present invention.

FIG. 1 illustrates in partial block diagram and partial schematic form a current-mode digital-to-analog converter (DAC) 30 according to the prior art. DAC 30 includes generally a current DAC 31, and a filter 32. Current DAC 31 is a current source which provides a current labelled "$I_{IN}$" at an output terminal thereof proportional to weightings of digital input signals (not shown). Filter 32 includes a current-to-voltage converter 33 and a biquadratic (biquad) filter 34. Current-to-voltage converter 33 has an input terminal connected to the output terminal of current DAC 31, and an output terminal. Biquad filter 34 has an input terminal connected to the output terminal of current-to-voltage converter 33, and an output terminal for providing signal $V_{OUT}$.

More specifically, current-to-voltage converter 33 includes an operational amplifier 40, and a resistor 41. Operational amplifier 40 has a negative input terminal connected to the output terminal of current DAC 31, and an output terminal forming the output terminal of current-to-voltage converter 33. Resistor 41 has a first terminal connected to the output terminal of operational amplifier 40, and a second terminal connected to the negative input terminal of operational amplifier 40.

Biquad filter 34 includes a resistor 51, a capacitor 53, a resistor 54, an operational amplifier 55, a capacitor 56, and a resistor 57. Resistor 51 has a first terminal connected to the output terminal of operational amplifier 40, and a second terminal connected to a node 52. Capacitor 53 has a first terminal connected to node 52, and a second terminal connected to $V_{SS}$. Resistor 54 has a first terminal connected to node 52, and a second terminal. Operational amplifier 55 has a negative input terminal connected to the second terminal of resistor 54, a positive input terminal for receiving reference voltage $V_{AG}$, and an output terminal for providing signal $V_{OUT}$. Capacitor 56 has a first terminal connected to the output terminal of operational amplifier 55, and a second terminal connected to the negative input terminal of operational amplifier 55. Resistor 57 has a first terminal connected to the output terminal of operational amplifier 55, and a second terminal connected to node 52.

In general, filter 32 implements a biquad filter function. Filter 32 includes current-to-voltage converter 33 prior to the actual biquad filter, biquad filter 34. Current-to-voltage converter 33 provides a good virtual ground at the output of current DAC 31 to avoid modulating current $I_{IN}$ as the input code to current DAC 31 changes. Current-to-voltage converter 33 receives the output signal of current DAC 31, signal $I_{IN}$, provides an operational amplifier virtual ground to current DAC 31, and creates a corresponding voltage output via resistor 41 in feedback around operational amplifier 40. Biquad filter 34 performs a transfer function expressed as:

$$H(s) = \frac{\frac{1}{R_{51}R_{54}C_{53}C_{56}}}{s^2 + \left(\frac{s}{C_{53}}\right)\left(\frac{1}{R_{51}} + \frac{1}{R_{57}} + \frac{1}{R_{54}}\right) + \frac{1}{C_{53}R_{57}C_{56}R_{54}}}$$

where $R_{51}$ is the resistance of resistor 51, $R_{57}$ is the resistance of resistor 57, $R_{54}$ is the resistance of resistor 54, $C_{53}$ is the capacitance of capacitor 53, and $C_{56}$ is the capacitance of capacitor 56.

However, filter 32 requires considerable area and power, especially when implemented in integrated circuit form. Operational amplifier 40, used to perform the current-to-voltage conversion, must have both high gain and high bandwidth, making it a fairly expensive design in terms of area and power consumption. Furthermore, filter 32 requires one resistor to perform the current-to-voltage conversion. Both resistor 41 in feedback around operational amplifier 40, and resistor 51 connected between the output of operational amplifier 40 and node 52, are required for an accurate filtering function. Integrated circuit resistors typically must be implemented in polysilicon due to polysilicon's low voltage coefficient; however, since polysilicon has a low sheet resistivity, a relatively large area is required to achieve a desired resistance.

FIG. 2 illustrates in partial block diagram and partial schematic form a current-mode DAC 60 using an area-efficient current-input filter 62 according to the present invention. DAC 60 includes generally a current DAC 61, and filter 62. Current DAC 61 is a current source which provides current $I_{IN}$ at an output terminal thereof proportional to weightings of digital input signals (not shown). Filter 62 includes generally a virtual ground circuit 70 and a biquad filter 80. Virtual ground circuit 70 includes an N-channel metal-oxide-semiconductor (MOS) transistors 71 and 73, a current source 74, and N-channel transistors 75 and 76. Transistor 71 has a drain providing an output terminal of virtual ground circuit 70, a gate, and a source connected to a node 72, which forms an input terminal of virtual ground circuit 70 and is connected to the output terminal of current DAC 61. Transistor 73 has a drain connected to node 72, a gate for receiving a bias voltage labelled "$V_{BIAS}$", and a source connected to $V_{SS}$. $V_{BIAS}$ is a bias voltage to bias transistors such as transistor 73 to act as a current source. Current source 74 has a first terminal connected to a power supply voltage terminal labelled "$V_{DD}$", and a second terminal connected to the gate of transistor 71. $V_{DD}$ is the more-positive power supply voltage terminal having a voltage of approximately 5.0 volts. Transistor 75 has a drain connected to the second terminal of current source 74 and to the gate of transistor 71, a gate for receiving a bias voltage labelled "$V_{CASC}$", and a source. $V_{CASC}$ is a bias voltage to bias cascode-connected transistors such as transistor 75 into saturation. Transistor 76 has a first terminal connected to the source of transistor 75, a gate connected to node 72, and a source connected to $V_{SS}$.

Biquad filter 80 includes a capacitor 83, a resistor 84, an operational amplifier 85, a capacitor 86, and a resistor 87. An input node 82 is connected to the drain of transistor 71 of virtual ground circuit 70. Capacitor 83 has a first terminal connected to input node 82, and a second terminal connected to $V_{SS}$. Resistor 84 has a first terminal connected to node 82, and a second terminal. Operational amplifier 85 has a negative input terminal connected to the second terminal of resistor 84, a positive input terminal for receiving reference voltage $V_{AG}$, and an output terminal for providing an output signal labelled "FILTER OUT". Capacitor 86 has a first terminal connected to the output terminal of operational amplifier 85, and a second terminal connected to the negative input terminal of operational amplifier 85. Resistor 87 has a first terminal connected to the output terminal of operational amplifier 85, and a second terminal connected to node 82.

In general, filter 62 is a current input filter with an input circuit, virtual ground circuit 70, which presents a wideband virtual ground to current DAC 61. Filter 80 is a standard, continuous time, lowpass biquad with the input resistor removed to enable it to accept a current input. Node 82 is the input to filter 80 which is a low frequency virtual ground. At higher frequencies however, node 82 modulates relative to the input signal. Virtual ground circuit 70 receives current input signal IIN at node 72, and transfers this current to filter 80 via a very high output impedance. The high gain amplifier structure in virtual ground circuit 70 includes a bias transistor 73 which sets the direct current (DC) current through filter 80, and a high-gain amplifier including transistors 76 and 75, and a cascode transistor 71. Transistor 75 is also a cascode transistor for the high gain circuit which is biased by a current source 74.

Virtual ground circuit 70 is a 'class A' amplifier, so transistor 73 sets the quiescent current level, which also sets the zero input voltage level at the output of the filter. This zero input voltage level is relative to $V_{AG}$, and is defined as the voltage resulting from the current from transistor 73 through resistor 87. Node 72 is regulated at a potential that is one gate-to-source voltage ($V_{GS}$) (the $V_{GS}$ of transistor 76) above $V_{SS}$. Input current IIN from current DAC 61 displaces the quiescent current from transistor 73, which causes the voltage at the output of the filter, signal FILTER OUT, to decrease. Due to the 'class A' nature of the circuit, the full-scale current from current DAC 61 must not exceed the bias current set through transistor 73. In other words, signal FILTER OUT the output of filter 80 can not fall below the $V_{AG}$ potential.

The necessity of virtual ground circuit 70 follows from the practical design considerations of current DAC 61. Typically, current DAC 61 is implemented with P-channel current sources which are biased from some bias point, and the current is turned 'on' or 'off' according to the input code to current DAC 61 (not shown). Even if cascoded current sources are used there is a finite output impedance, which accounts for some variability in the value of $I_{IN}$ relative to the absolute potential at the output of current DAC 61. If the potential at the output of current DAC 61 changes as a function of output current $I_{IN}$, this can cause signal-dependent distortion. The output impedance of current DAC 61 can be increased by increasing the gate length of the transistors, yet this results in more area consumption, and less headroom. If the drain-to-source saturation voltage ($V_{DSAT}$) Of the current sources becomes too large, then the absolute potential at the output of current DAC 61 can push the current source out of saturation, causing a drastic reduction in the output impedance of the current sources.

If the output of current DAC 61, signal IIN, were provided directly to node 82, the filtering function would operate properly, and for low frequencies, there would be little or no modulation of the output of the current DAC. However, at frequencies closer to the passband edge, there would be significant modulation of node 82. For a given output impedance in the current sources associated with current DAC 61, the result would be distortion. DAC 60 includes virtual ground circuit 70, which presents a wideband virtual ground at node 72 that has a low impedance input for all frequencies in the passband. Virtual ground circuit 70 performs this function, and has an output impedance which is high enough that the modulation at node 82 does not cause distortion. In this case the current-to-voltage conversion is performed in filter 80 by resistor 87.

Filter 62 requires considerably less integrated circuit area and consumes considerably less power than filter 32 of FIG. 1. By using virtual ground circuit 70, filter 62 replaces operational amplifier 40 and resistors 41 and 51 with a circuit having only four transistors and a current source. Since virtual ground circuit 70 does not provide a transimpedance function (i.e., a current to voltage conversion), the output is still a current which may be input directly to node 82 in biquad filter 80. Filter 62 operates with high linearity by virtue of a very high gain in the path from node 72 to the gate of transistor 71. The impedance at the input node 72 is lowered by the gain of the amplifier circuit which makes it a very accurate virtual ground. In addition, the output impedance of the virtual ground circuit is made very high by the high gain amplifier. This very high output impedance allows very high linearity even when node 82 has signal dependent modulation at higher frequencies in the passband.

Filter 62 may by modified in several ways. For example, if current DAC 61 is made of N-channel current sources, a mirrored version of filter circuit 62 may be used to accommodate the change in input current polarity. The result would be a virtual ground circuit made of P-channel transistors. The filter structure would remain very similar except for the V AG potential. Another variation would be the use of bipolar transistors in place of the MOS transistors to implement this function, or a combination of bipolar and MOS transistors in a bipolar-complementary MOS (BiCMOS) process. In some cases, transistor 75 of virtual ground circuit 70 may be omitted if less gain in the amplifier circuit is sufficient for the linearity specification. Transistor 75 acts as a cascode device to increase the output impedance and therefore the gain of the amplifier structure.

While the invention has been described in the context of a preferred embodiment, it will be apparent to those skilled in the art that the present invention may be modified in numerous ways and may assume many embodiments other than that specifically set out and described above. For example, while the virtual ground circuit was illustrated in the context of N-channel MOS transistors, it may be implemented with P-channel MOS transistors, bipolar transistors, or the like. Filters with different transfer functions besides the illustrated biquad filter may be used. Also, filter 62 is applicable to different sources of input current besides the illustrated current DAC. Accordingly, it is intended by the appended claims to cover all modifications of the invention which fall within the true spirit and scope of the invention.

We claim:

1. An area-efficient current-input filter, comprising:
a first node for receiving an input current thereinto;
a filter having an input terminal for receiving an intermediate current, and an output terminal for providing a filtered output signal in response to a predetermined filter transfer function applied to said intermediate current, said input terminal coupled to a second node;
a first transistor having a first current electrode coupled to said first node, a second current electrode coupled to said second node, and a control electrode;
a first current source having a first terminal coupled to said first node, and a second terminal coupled to a first power supply voltage terminal;
a second current source having a first terminal coupled to a second power supply voltage terminal, and a second terminal coupled to said control electrode of said first transistor; and
a second transistor having a first current electrode coupled to said control electrode of said first transistor, a control electrode coupled to said first node, and a second current electrode coupled to said first power supply voltage terminal.

2. The area-efficient current-input filter of claim 1 further comprising a third transistor having a first current electrode coupled to said second terminal of said second current source and to said control electrode of said first transistor, a control electrode for receiving a bias voltage, and a second current electrode coupled to said first current electrode of said second transistor.

3. The area-efficient current-input filter of claim 2 wherein said first, second, and third transistors comprise N-channel metal-oxide semiconductor (MOS) transistors.

4. The area-efficient current-input filter of claim 1 wherein said first current source comprises a third transistor having a first current electrode coupled to said first node, a control electrode for receiving a bias voltage, and a second current electrode coupled to said first power supply voltage terminal.

5. The area-efficient current-input filter of claim 1 wherein said filter is characterized as being a biquadratic filter.

6. The area-efficient current-input filter of claim 5 wherein said filter comprises:
 a first capacitor having a first terminal coupled to said second node, and a second terminal coupled to said first power supply voltage terminal;
 a first resistor having a first terminal coupled to said second node, and a second terminal;
 an operational amplifier having a negative input terminal coupled to said second terminal of said first resistor, a positive input terminal for receiving a reference voltage, and an output terminal for providing said filtered output signal;
 a second capacitor having a first terminal coupled to said output terminal of said operational amplifier, and a second terminal coupled to said negative input terminal of said operational amplifier; and
 a second resistor having a first terminal coupled to said output terminal of said operational amplifier, and a second terminal coupled to said second node.

7. An area-efficient current-input filter, comprising:
 a first node for receiving an input current;
 a second node for receiving an intermediate current;
 a filter having an input terminal coupled to said second node for receiving said intermediate current, and an output terminal for providing a filtered output signal in response to a predetermined filter transfer function; and
 virtual ground means coupled to said first and second nodes, for reducing an input impedance into said first node, said virtual ground means characterized as including only transistors and current sources, wherein said virtual ground means comprises:
 a first transistor having a first current electrode coupled to said first node, a second current electrode coupled to said second node, and a control electrode;
 a first current source having a first terminal coupled to said first node, and a second terminal coupled to a first power supply voltage terminal;
 a second current source having a first terminal coupled to a second power supply voltage terminal, and a second terminal coupled to said control electrode of said first transistor; and
 a second transistor having a first current electrode coupled to said control electrode of said first transistor, a control electrode coupled to said first node, and a second current electrode coupled to said first power supply voltage terminal.

8. The area-efficient current-input filter of claim 7 further comprising a third transistor having a first current electrode coupled to said second terminal of said second current source and to said control electrode of said first transistor, a control electrode for receiving a bias voltage, and a second current electrode coupled to said first current electrode of said second transistor.

9. The area-efficient current-input filter of claim 8 wherein said first, second, and third transistors comprise N-channel metal-oxide semiconductor (MOS) transistors.

10. The area-efficient current-input filter of claim 7 wherein said first current source comprises a third transistor having a first current electrode coupled to said first node, a control electrode for receiving a bias voltage, and a second current electrode coupled to said first power supply voltage terminal.

11. The area-efficient current-input filter of claim 7 wherein said filter is characterized as being a biquadratic filter.

12. The area-efficient current-input filter of claim 11 wherein said filter comprises:
 a first capacitor having a first terminal coupled to said second node, and a second terminal coupled to a first power supply voltage terminal;
 a first resistor having a first terminal coupled to said second node, and a second terminal;
 an operational amplifier having a negative input terminal coupled to said second terminal of said first resistor, a positive input terminal for receiving a reference voltage, and an output terminal for providing said filtered output signal;
 a second capacitor having a first terminal coupled to said output terminal of said operational amplifier, and a second terminal coupled to said negative input terminal of said operational amplifier; and
 a second resistor having a first terminal coupled to said output terminal of said operational amplifier, and a second terminal coupled to said second node.

13. A virtual ground circuit comprising:
 a first node for receiving an input current thereinto;
 a second node for providing an output current therefrom;
 a first transistor having a first current electrode coupled to said first node, a second current electrode coupled to said second node, and a control electrode;
 a first current source having a first terminal coupled to said first node, and a second terminal coupled to a first power supply voltage terminal;
 a second current source having a first terminal coupled to a second power supply voltage terminal, and a second terminal coupled to said control electrode of said first transistor; and
 a second transistor having a first current electrode coupled to said control electrode of said first transistor, a control electrode coupled to said first node, and a second current electrode coupled to said first power supply voltage terminal.

14. The virtual ground circuit of claim 13 further comprising a third transistor having a first current electrode coupled to said second terminal of said second current source and to said control electrode of said first transistor, a control electrode for receiving a bias voltage, and a second current electrode coupled to said first current electrode of said second transistor.

15. The virtual ground circuit of claim 14 wherein each of said first, second, and third transistors comprise N-channel metal-oxide semiconductor (MOS) transistors.

16. The virtual ground circuit of claim 13 wherein said first current source comprises a third transistor having a first current electrode coupled to said first node, a control electrode for receiving a bias voltage, and a second current electrode coupled to said first power supply voltage terminal.

17. A method for filtering an input current to provide an output signal in response thereto, comprising the steps of:

receiving the input current at a first node;

providing an intermediate current to a second node in response to the input current at said first node;

filtering said intermediate current at said second node to provide the output signal in response to a predetermined filter transfer function;

sinking a predetermined current from said first node;

controlling a conductivity of a first transistor in response to a voltage at said first node;

sourcing a current to a third node;

coupling a current conduction path of said first transistor between said third node and a power supply voltage terminal; and controlling a conductivity of a second transistor connected between said first node and said second node in response to a voltage at said third node.

18. The method of claim 17 wherein said step of filtering comprises the step of filtering said intermediate current at said second node to provide the output signal in response to a biquadratic filter function.

19. The method of claim 18 wherein further comprising the steps of:

coupling a cascode transistor between said third node and said first current electrode of said first transistor; and biasing a control electrode of said cascode transistor with a reference voltage.

* * * * *